(12) United States Patent
Guijarro et al.

(10) Patent No.: US 9,355,348 B2
(45) Date of Patent: May 31, 2016

(54) SMART CARD AND METHOD OF PRODUCTION

(71) Applicants: Sebastien Guijarro, Meudon (FR); Thierry Laviron, Meudon (FR); Lucile Dossetto, Meudon (FR)

(72) Inventors: Sebastien Guijarro, Meudon (FR); Thierry Laviron, Meudon (FR); Lucile Dossetto, Meudon (FR)

(73) Assignee: GEMALTO SA, Meudon (FR)

( * ) Notice: Subject to any disclaimer, the term of this patent is extended or adjusted under 35 U.S.C. 154(b) by 0 days.

(21) Appl. No.: 14/387,222

(22) PCT Filed: Mar. 21, 2013

(86) PCT No.: PCT/EP2013/055934
§ 371 (c)(1),
(2) Date: Sep. 22, 2014

(87) PCT Pub. No.: WO2013/139910
PCT Pub. Date: Sep. 26, 2013

(65) Prior Publication Data
US 2015/0129661 A1    May 14, 2015

(30) Foreign Application Priority Data
Mar. 22, 2012 (EP) .................... 12305334

(51) Int. Cl.
*G06K 19/077* (2006.01)
*H05K 3/30* (2006.01)

(52) U.S. Cl.
CPC ........ *G06K 19/07703* (2013.01); *G06K 19/077* (2013.01); *G06K 19/0772* (2013.01); *G06K 19/07745* (2013.01); *H05K 3/30* (2013.01); *H01L 2224/48091* (2013.01); *H01L 2224/48228* (2013.01)

(58) Field of Classification Search
CPC ................................. G06K 19/07703
USPC .................................. 235/492, 488
See application file for complete search history.

(56) References Cited

U.S. PATENT DOCUMENTS

| 4,841,134 | A | 6/1989 | Hida |
| 6,259,035 | B1 * | 7/2001 | Truggelmann ............ C23C 2/04 174/250 |
| 6,519,497 | B1 * | 2/2003 | Blome et al. ................. 700/58 |
| 2006/0208907 | A1 | 9/2006 | Kokuryo et al. |
| 2010/0050197 | A1 * | 2/2010 | Griffin ............... G11B 7/24012 720/745 |
| 2010/0311579 | A1 * | 12/2010 | Koga et al. .................... 503/200 |
| 2011/0163167 | A1 * | 7/2011 | Artigue et al. ................ 235/488 |

FOREIGN PATENT DOCUMENTS

| DE | 4328469 A1 | 3/1995 |
| FR | 2862410 A1 | 5/2005 |

OTHER PUBLICATIONS

PCT/EP2013/055934, International Search Report, May 7, 2013, European Patent Office, P.B. 5818 Patentlaan 2 NL—2280 HV Rijswijk.
Translation of PCT/EP2013/055934, International Search Report, May 7, 2013, European Patent Office, P.B. 5818 Patentlaan 2 NL—2280 HV Rijswijk.

* cited by examiner

*Primary Examiner* — Allyson Trail
(74) *Attorney, Agent, or Firm* — The Jansson Firm; Pehr B. Jansson

(57) ABSTRACT

The present invention relates to a smart card comprising a card body and an electronic module placed within a recess of the card body and further comprising at least one colored layer placed between the electronic module and the bottom of the recess of the card body.

9 Claims, 1 Drawing Sheet

SMART CARD AND METHOD OF PRODUCTION

BACKGROUND

1. Field of the Invention

This invention relates to the technical field of electronic modules, methods for manufacturing electronic modules, and electronic devices, in particular smart cards, comprising at least one electronic module. More specifically, the invention relates to secure electronic modules.

2. Description of the Related Art

In general, electronic modules are formed by a dielectric support film on which a metallised layer is laminated. On the side opposite the metallised layer, a microchip is glued and connected to different zones of the metallised layer.

In an electronic device, the electronic module is glued into a recess provided for that purpose in the body of the device.

That kind of electronic module finds application especially in smart cards.

Generally, in order to protect the microchip and its connections to the different zones of the metal layer, it is encapsulated by moulding protective resin on the electronic module. Such encapsulation is usually achieved with epoxy resin or epoxy mould compounds (EMCs), which are dark in colour. For their part, the card bodies in which the electronic modules are placed are generally made in light coloured plastic material, which makes it possible, by contrast, to see the electronic module through the card body.

In the field of top-quality smart cards, the fact that the electronic module is visible through the card is not acceptable from a marketing point of view. However, there are light-coloured EMCs, which would be invisible through the card; however, these are very costly and difficult to implement. That is because these EMCs tend to stick to the mould and the production line must be stopped frequently to clean the mould, thus increasing costs.

The problem of the visibility of the electronic module through the card body could also be avoided by applying a personalising coat on the back of the smart card, thus making the electronic module invisible. However, for certain types of secure card, the back of the card is coated with a transparent security coat on which no opaque coat is applied, in order precisely to keep the card secure.

SUMMARY OF THE INVENTION

One of the aims of this invention is thus to remedy at least some of the drawbacks of the prior art and propose a smart card and its manufacturing method to make the electronic module invisible through the card.

Thus, this invention relates to a smart card comprising a card body and an electronic module placed in a recess of the card body and further comprising at least one coloured coat placed between the electronic module and the bottom of the recess of the card body.

In one aspect of the invention, the colour of the at least one coloured coat is identical to the colour of the card body.

In another aspect of the invention, the electronic module comprises protective resin and at least one coloured coat is applied on said protective resin.

In another aspect of the invention, at least one coloured coat is applied on the bottom of the recess of the card body.

In another aspect of the invention, the at least one coloured coat is applied by printing ink.

This invention also relates to a method for manufacturing a smart card comprising a card body and an electronic module placed in a recess of the card body, characterised in that said manufacturing method comprises at least one step for applying at least one coloured coat between the electronic module and the bottom of the recess of the card body.

In one aspect of the method in the invention, at least one step for applying the at least one coloured coat on the bottom of the recess of the card body is carried out.

In another aspect of the method according to the invention, the electronic module comprises protective resin and the at least one step of applying the at least one coloured coat is performed on said protective resin.

In another aspect of the method according to the invention, the step for applying the at least one coloured coat is carried out during the encapsulation process, between a step of encapsulating the electronic module and a step of inspecting said electronic module.

In another aspect of the method according to the invention, the step for applying the at least one coloured coat is an ink printing step.

In another aspect of the method according to the invention, the printing step is carried out by stamping.

BRIEF DESCRIPTION OF THE DRAWINGS

Other characteristics and benefits of the invention will become clearer in the description below, provided as an illustrative and non-limitative example, and the attached drawings, where.

DETAILED DESCRIPTION

Identical elements in all the figures are designated by the same reference numbers.

Figure 1:
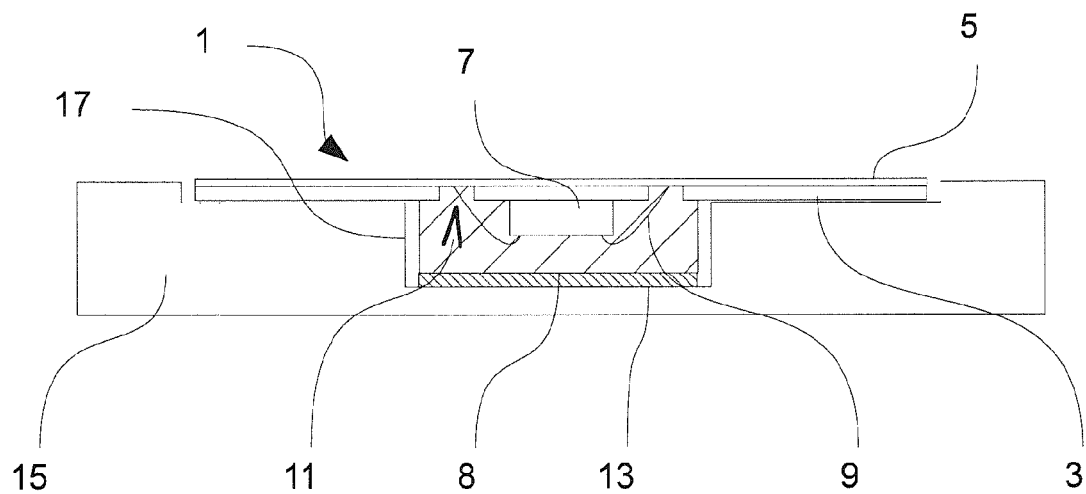
FIG. 1 is a schematic sectional representation of an electronic module inserted in a card body.

FIG. 1 is a schematic sectional representation of an electronic module 1 inserted in a card body 15. The electronic module 1 comprises a dielectric support film 3 with at least one electrical contact zone 5 on one side, and on the other side a microchip 7 connected to said at least one electrical contact zone 5 by connections 9 passing in holes 11 through the support film 3, wherein said microchip 7 and connections 9 are coated in protective resin 8, for example of the epoxy type.

For its part, the card body comprises a recess 17 in which the electronic module 1 is placed, so that the side carrying the electrical contact zone 5 is turned towards the outside of the recess 17. The electronic module 1 is generally held inside the recess 17 by means of adhesive (not shown).

Between the protective resin 8 and the bottom of the recess 17 of the card body 15, at least one coloured coat 13 is applied. That coloured coat 13, which is in the same colour as the card body 15, is sufficiently opaque to reduce the visibility of the electronic module 1 through the card body 15. That is because the protective resins 8 used to coat the microchip 7 and its connections 9 are generally dark in colour, whereas the card body 15 is light in colour. The addition of at least one coloured coat 13 between these components thus makes it possible to hide the colour of the protective resin 8 and therefore conceal the presence of the electronic module 1 through the card body 15.

A coloured coat 13 may be applied on the electronic module 1, more precisely on the protective resin 8 of the module or on the bottom of the recess 17 of the card body 15 or on both at the same time, if several coloured coats 13 are present between the electronic module 1 and the bottom of the recess 17. In the example presented in FIG. 1, only one coloured coat 13 is present between the protective resin 8 and the bottom of the recess 17 of the card body 15.

That coloured coat 13 is preferably made by printing with opaque ink, conventionally used in the field of smart cards, in a colour identical to the card body, to form a coat that is about 10 to 15 pm thick. If a coloured coat 13 is applied on the bottom of the recess 8, the ink used is then an ink that is known to the person skilled in the art and that can adhere to the protective resin 8. If a coloured coat 13 is applied on the bottom of the recess 17, the ink used is then an ink that is known to the person skilled in the art and that can adhere to the material in which the card body is made.

Figure 2:
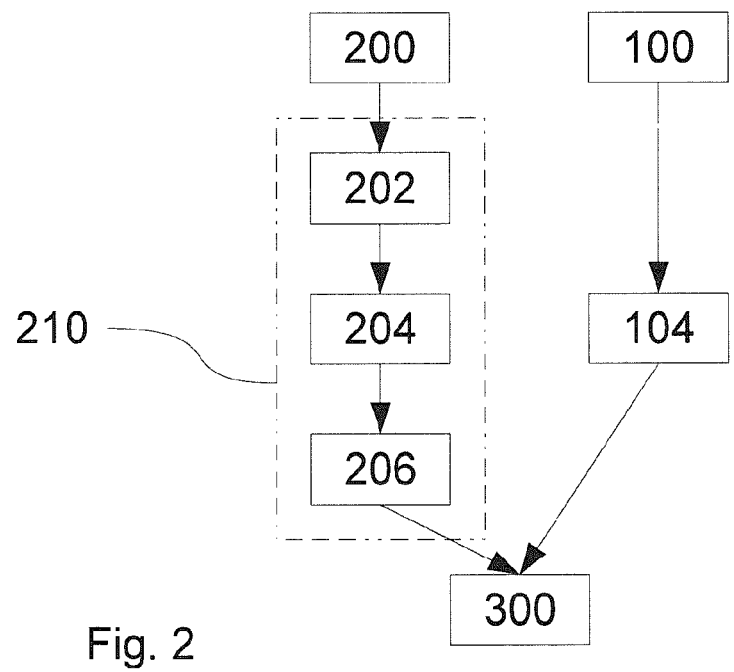
FIG. 2 is an organisation chart of the various steps of a method for manufacturing an electronic module and a smart card.

FIG. 2 is an organisation chart of a method for manufacturing a smart card comprising an electronic module 1 placed in a recess 17 of a card body 15 and comprising at least one coloured coat 13 placed between the protective resin 8 of the electronic module and the bottom of the recess 17 of the card body 15.

The first steps 100 and 200, known to the person skilled in the art, are steps for supplying the components making up the final smart card respectively.

This is a step 200 of supplying an electronic module 1 comprising a dielectric support film 3 with at least one electrical contact zone 5 on one side, and on the other side a microchip 7 connected to said at least one electrical contact zone 5 by connections 9 passing in holes 11 through the support film 3 and a step 100 of supplying a card body 15 comprising a recess 17. Generally, these components are supplied from reels and are part of the standard manufacturing method known to the person skilled in the art.

Following the step 200 of supplying the electronic module 1, a conventional encapsulation method 210 known to the person skilled in the art is carried out on the electronic module 1.

That encapsulation method 210 may particularly comprise an encapsulation step 202 carried out on the electronic module 1. That step consists in applying protective resin 8 on the electronic module 1, for example by means of a module that covers the microchip 7 and its connections 9 in which epoxy resin is injected.

Following the encapsulation step 202, an inspection step 206 is carried out to inspect the electronic module 1. This is a conventional step in the encapsulation method and is essentially aimed at visually verifying the quality of the encapsulation.

Between the encapsulation step 202 and the inspection step 206, an additional step 204 is carried out to apply a coloured coat 13 on the protective resin 8. That application step 204 particularly consists in applying, on the protective resin 8, a coloured coat 13 in a colour identical to the colour of the card body 15.

That application step 204 is carried out just after the encapsulation step 202. More precisely, in the production line and after the production unit that carries out the encapsulation in step 202, an application unit is installed to apply the coloured coat 13. The fact that the coloured coat 13 is applied at that time makes it possible to reduce the impact of the application step 204 on the time and cost of the method for manufacturing a smart card known to the person skilled in the art.

The application unit may, for example preferably, be a stamping unit, that is to say a unit where an ink pad collects ink from a source and deposits it on the protective resin 8, forming a coat that is about 10 to 15 μm thick. The same ink pad can print on several electronic modules 1 at the same time. However, the application unit may very well be a printing unit using screen printing, inkjet printing, a unit applying a self-adhesive coloured coat 13 or any other means known to the person skilled in the art.

At the same time and optionally, following the step 100 of supplying a card body 15, another step 104 for applying a coloured coat 13 at the bottom of the recess 17 of the card body 15 may be carried out. This other application step 104 can also be carried out by a printing unit using stamping, screen printing, inkjet printing, a unit applying a self-adhesive coloured coat 13 or any other means known to the person skilled in the art.

The last step 300 of the method of manufacturing a smart card consists in a conventional card embedding step, that is to say where the electronic module 1 is put in place and fixed in the recess 17 of the card body 15.

Thus, it can be seen that the smart card according to the invention makes it possible to reduce the visibility of the electronic module 1, particularly its protective resin 8, through the card body 15 due to the presence of at least one coloured coat 13 placed between the bottom of the recess 17 of the card body 15 and the electronic module 1. In addition, the application of that coloured coat 13 has a limited impact on the production time and cost, because it is carried out during the encapsulation process 210.

The invention claimed is:

1. A smart card comprising a card body and an electronic module placed in a cavity of the card body, said electronic module comprising a microchip connected through connections with at least one electrical contact zone on the top of the cavity of the card body, and a protective resin in which said microchip and connections are coated, wherein the electronic module further comprises at least a coloured layer applied on the protective resin before placing the electronic module in the card body, so that a coloured coat is formed between the protective resin and the bottom of the cavity of the card body, said coloured coat being sufficiently opaque to reduce the visibility of the electronic module through the bottom of the card body.

2. The smart card according to claim 1, wherein the colour of the at least one coloured coat is identical to the colour of the card body.

3. The smart card according to claim 1, wherein at least one coloured coat is applied on the bottom of the recess of the card body.

4. The smart card according to claim 1, wherein the at least one coloured coat is applied by means of ink printing.

5. A method for manufacturing a smart card comprising:
providing a card body and an electronic module placed in a cavity of the card body, said electronic module comprising a microchip connected through connections with at least one electrical contact zone on the top of the cavity of the card body, and a protective resin in which said microchip and connections are coated,
applying at least a coloured layer on said protective resin before placing the electronic module in the card body, so that a coloured coat is formed between the protective resin and the bottom of the cavity of the card body, said coloured coat being sufficiently opaque to reduce the visibility of the electronic module through the bottom of the card body.

6. The manufacturing method according to claim 5, wherein the colour of the at least one coloured coat is identical to the colour of the card body.

7. The manufacturing method according to claim 5, wherein at least one coloured coat is applied on the bottom of the recess of the card body.

8. The manufacturing method according to claim 5, wherein the step of applying the at least one coloured coat is carried out by means of ink printing.

9. The manufacturing method according to claim 8, wherein the ink printing step is carried out by stamping.

* * * * *